(12) United States Patent
Lee et al.

(10) Patent No.: US 11,239,104 B2
(45) Date of Patent: Feb. 1, 2022

(54) CHIP EJECTING APPARATUS

(71) Applicant: SAMSUNG ELECTRONICS CO., LTD., Suwon-Si (KR)

(72) Inventors: Jae Ryoung Lee, Asan-Si (KR); Sang Hwan Kim, Cheonan-Si (KR); Min Sung Kim, Asan-Si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 97 days.

(21) Appl. No.: 16/568,562

(22) Filed: Sep. 12, 2019

(65) Prior Publication Data

US 2020/0294839 A1    Sep. 17, 2020

(30) Foreign Application Priority Data

Mar. 12, 2019  (KR) .......................... 10-2019-0028028

(51) Int. Cl.
*H01L 21/683* (2006.01)
*B32B 43/00* (2006.01)
*H01L 21/67* (2006.01)

(52) U.S. Cl.
CPC ........ *H01L 21/6836* (2013.01); *B32B 43/006* (2013.01); *H01L 21/67132* (2013.01); *H01L 2221/68381* (2013.01); *H01L 2221/68386* (2013.01); *Y10S 156/93* (2013.01); *Y10S 156/932* (2013.01); *Y10S 156/941* (2013.01); *Y10S 156/943* (2013.01);
(Continued)

(58) Field of Classification Search
CPC ......... B32B 43/006; H01L 2221/68381; H01L 2221/68386; Y10T 156/1137; Y10T 156/1179; Y10T 156/1939; Y10T 156/1983; Y10S 156/93; Y10S 156/932; Y10S 156/941; Y10S 156/943
See application file for complete search history.

(56) References Cited

U.S. PATENT DOCUMENTS 6,759,274 B2   7/2004  Arai et al.
6,889,427 B2   5/2005  Yee et al.
(Continued)

FOREIGN PATENT DOCUMENTS

JP    2000-138277    5/2000
JP    2001-189399    7/2001
(Continued)

OTHER PUBLICATIONS

Google Patents translation of KR20130130391A. (Year: 2021).*

*Primary Examiner* — Mark A Osele
(74) *Attorney, Agent, or Firm* — F. Chau & Associates, LLC

(57) ABSTRACT

A chip ejecting apparatus includes a table configured to be provided with a dicing tape and a target chip adhered to an upper surface of the dicing tape, an ejector unit including a plurality of gas holes configured to inject a gas toward a lower surface of the dicing tape, and a control unit configured to separately control on/off operations of the plurality of gas holes and select an active gas hole group from the plurality of gas holes. The active gas hole group is selected to overlap the target chip, and is configured to inject the gas toward the dicing tape along a direction from a first edge of the target chip toward a second edge of the target chip opposite to the first edge of the target chip.

17 Claims, 22 Drawing Sheets

(52) U.S. Cl.
CPC .... *Y10T 156/1137* (2015.01); *Y10T 156/1179* (2015.01); *Y10T 156/1939* (2015.01); *Y10T 156/1983* (2015.01)

(56) References Cited

U.S. PATENT DOCUMENTS

| | | | | |
|---|---|---|---|---|
| 7,406,759 | B2* | 8/2008 | Yamamoto | H01L 21/67092 |
| | | | | 156/247 |
| 7,757,742 | B2* | 7/2010 | Cheung | H01L 21/67132 |
| | | | | 156/754 |
| 8,470,130 | B2* | 6/2013 | Chong | H01L 21/67132 |
| | | | | 156/707 |
| 9,929,036 | B2* | 3/2018 | Kwong | H01L 21/6838 |
| 10,090,177 | B1* | 10/2018 | Minnich | H05K 13/0061 |
| 2014/0027049 | A1 | 1/2014 | Joo et al. | |
| 2016/0204017 | A1* | 7/2016 | Roesner | H01L 21/67132 |
| | | | | 156/272.2 |

FOREIGN PATENT DOCUMENTS

| | | |
|---|---|---|
| JP | 2010-129588 | 6/2010 |
| KR | 10-2000-0031043 | 6/2000 |
| KR | 10-1271291 | 6/2013 |
| KR | 10-1322516 | 10/2013 |
| KR | 10-1350642 | 1/2014 |
| KR | 10-2016-0149723 | 12/2016 |

* cited by examiner

CHIP EJECTING APPARATUS

CROSS-REFERENCE TO RELATED APPLICATION

This application claims priority under 35 U.S.C. § 119 to Korean Patent Application No. 10-2019-0028028, filed on Mar. 12, 2019, in the Korean Intellectual Property Office, the disclosure of which is hereby incorporated by reference in its entirety.

TECHNICAL FIELD

Example embodiments of the present disclosure relate to a chip ejecting apparatus, and, more specifically, to a chip ejecting apparatus for separating a chip from dicing tape using a gas.

DISCUSSION OF RELATED ART

Semiconductor devices are formed on a wafer (e.g., a silicon wafer) by repeating a series of manufacturing processes. Each wafer on which the semiconductor devices are formed can be divided into a plurality of chips through a dicing process. The divided chips may each be bonded on a substrate (e.g., a printed circuit board (PCB)) or a lead frame through a die attaching process.

An apparatus for performing the die attaching process may include an ejector unit for separating the chips from the wafer on which the dicing process is performed, a picker unit for picking up the separated chips, and a bonding unit for bonding the picked-up chips to the substrate. To prevent the chips from seceding during the dicing process, dicing tape may be attached to a back surface of the wafer. Individual chips can be separated from the dicing tape by the ejector unit after dicing.

However, existing ejector units may not be suitable for separating chips with reduced thickness, or that vary in size. Therefore, there is a need in the art for improved systems and methods for separating chips from dicing tape.

SUMMARY

According to example embodiments of the inventive concepts, a chip ejecting apparatus may include a table provided with a dicing tape and a target chip adhered to an upper surface of the dicing tape, an ejector including a plurality of gas holes configured to inject a gas toward a lower surface of the dicing tape, and a controller configured to separately control on/off operations of the plurality of gas holes and select an active gas hole group from the plurality of gas holes. The active gas hole group may be selected to overlap the target chip, and may be configured to inject the gas toward the dicing tape along a direction from a first edge of the target chip toward a second edge of the target chip opposite to the first edge of the target chip.

According to example embodiments of the inventive concepts, a chip ejecting apparatus may include a table provided with a dicing tape and a target chip adhered to an upper surface of the dicing tape, an ejector configured to separate the target chip from the dicing tape, and a picker configured to pick up the separated target chip. The ejector may include a plurality of gas holes configured to inject a gas toward a lower surface of the dicing tape and an eject pin configured to project in a direction crossing a direction parallel to the lower surface of the dicing tape. The plurality of gas holes may be configured to perform a sweeping operation in which the gas is injected toward the target chip along a direction from a first edge of the target chip toward a second edge of the target chip opposite to the first edge of the target chip. The eject pin may be configured to extend toward the target chip and to provide the target chip to the picker unit, after the sweeping operation.

According to example embodiments of the inventive concepts, a chip ejecting apparatus may include a table provided with a dicing tape and a target chip adhered to an upper surface of the dicing tape, an ejector including a plurality of gas holes configured to inject a gas toward a lower surface of the dicing tape, and a controller configured to separately control on/off operations of the plurality of gas holes and to select an active gas hole group from the plurality of gas holes. The active gas hole group may be selected to overlap the target chip, and may include a first gas hole group adjacent to a first edge of the target chip and a second active gas hole group adjacent to a central portion of the target chip. The controller may be configured to perform an on operation of the second gas hole group after performing an on operation of the first gas hole group.

According to example embodiments of the inventive concepts, a method is provided for ejecting a chip, the method comprising injecting first gas from one or more gas holes toward a lower surface of the dicing tape beneath a first portion of a target chip; injecting second gas from the one or more gas holes toward the lower surface of the dicing tape beneath a second portion of the target chip; extending one or more eject pins toward the dicing tape to raise the target chip; and picking up the raised target chip.

DETAILED DESCRIPTION

Figure 1:
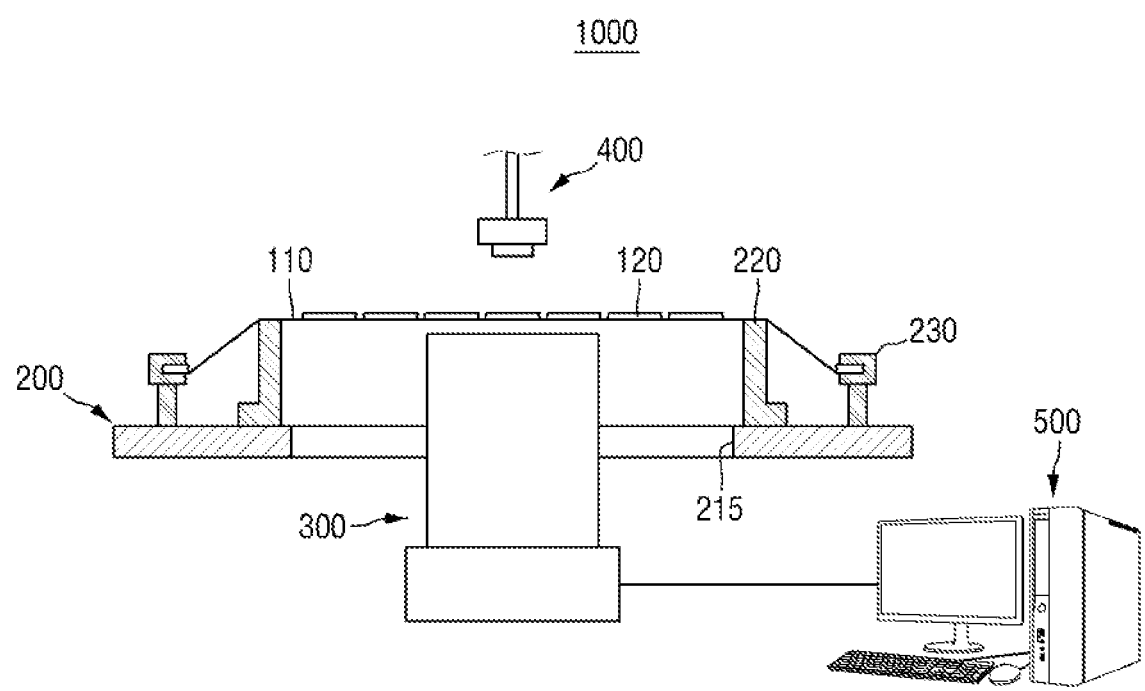
FIG. 1 is a schematic configuration diagram illustrating a chip ejecting apparatus according to example embodiments of the inventive concept.

The present disclosure provides systems and methods for separating chips from a wafer or from dicing tape. According to at least one embodiment, the adhesive force between the chip and the wafer (or dicing tape) can be lowered by using a gas, without physical contact between the chip ejecting apparatus. Therefore, damage to the chip can be reduced. Furthermore, embodiments of the present disclosure include individually controllable gas holes so that chips of various sizes can be separated from the wafer or dicing tape without using the same chip ejecting apparatus.

Various example embodiments will now be described more fully hereinafter with reference to the accompanying drawings. Like reference numerals may refer to like elements throughout this application.

Figure 2:
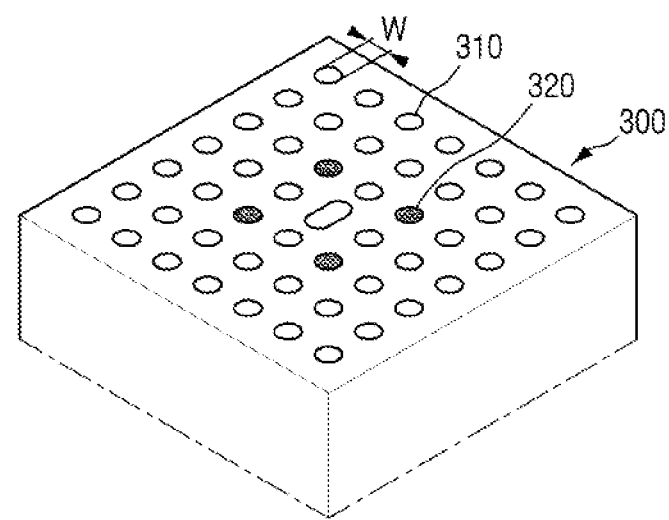
FIG. 2 is a schematic perspective view illustrating an ejector unit of FIG. 1 according to example embodiments of the inventive concept.
Figure 3:
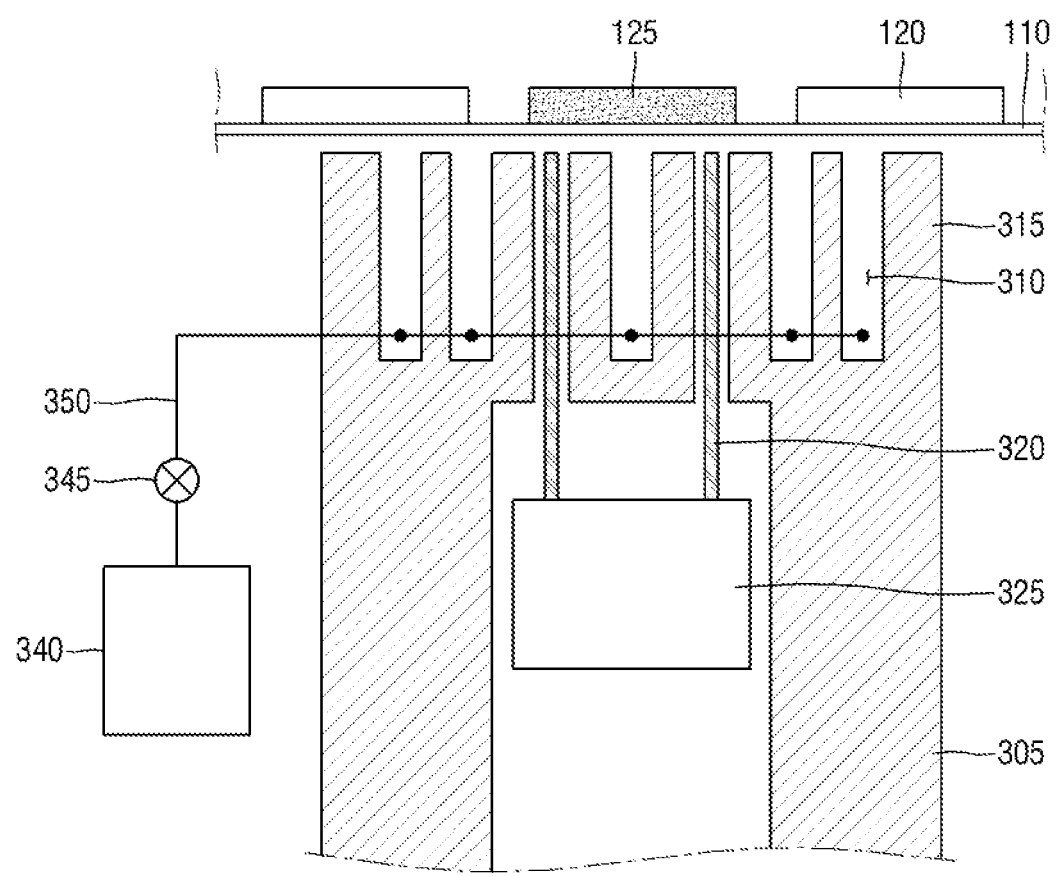
FIG. 3 is a schematic cross-sectional view illustrating an ejector unit of FIG. 1 according to example embodiments of the inventive concept.
Figure 4:
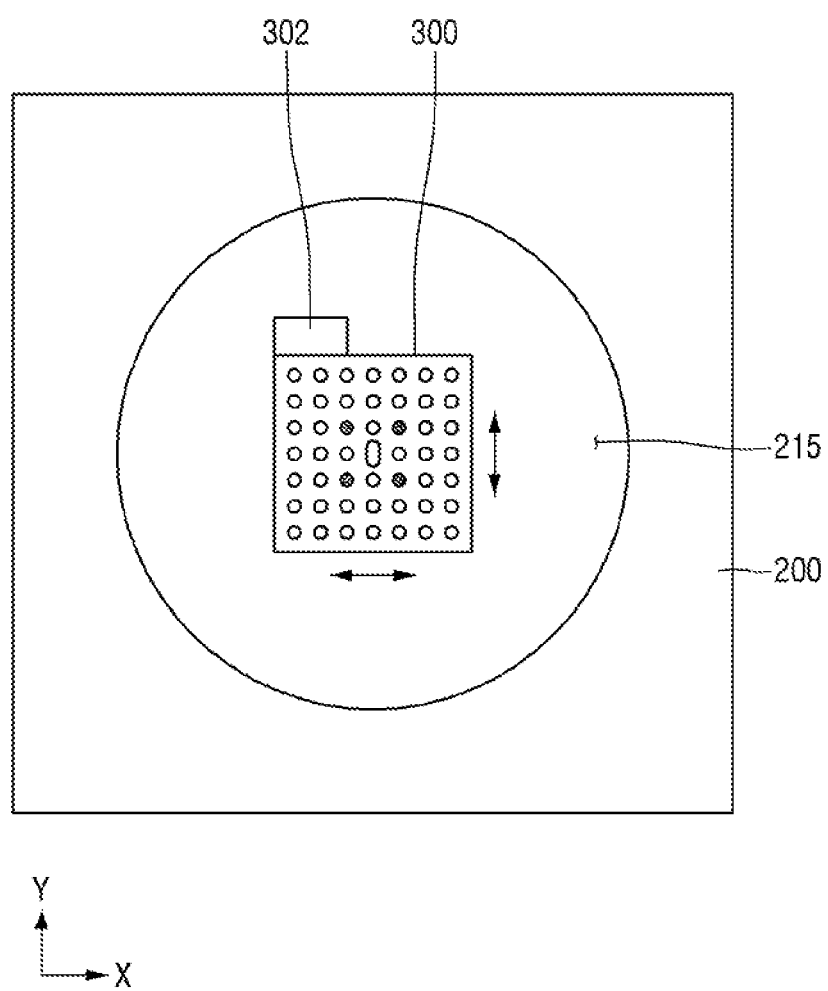
FIGS. 4 and 5 are schematic plan views illustrating a table and an ejector unit of a chip ejecting apparatus according to example embodiments of the inventive concept.
Figure 5:
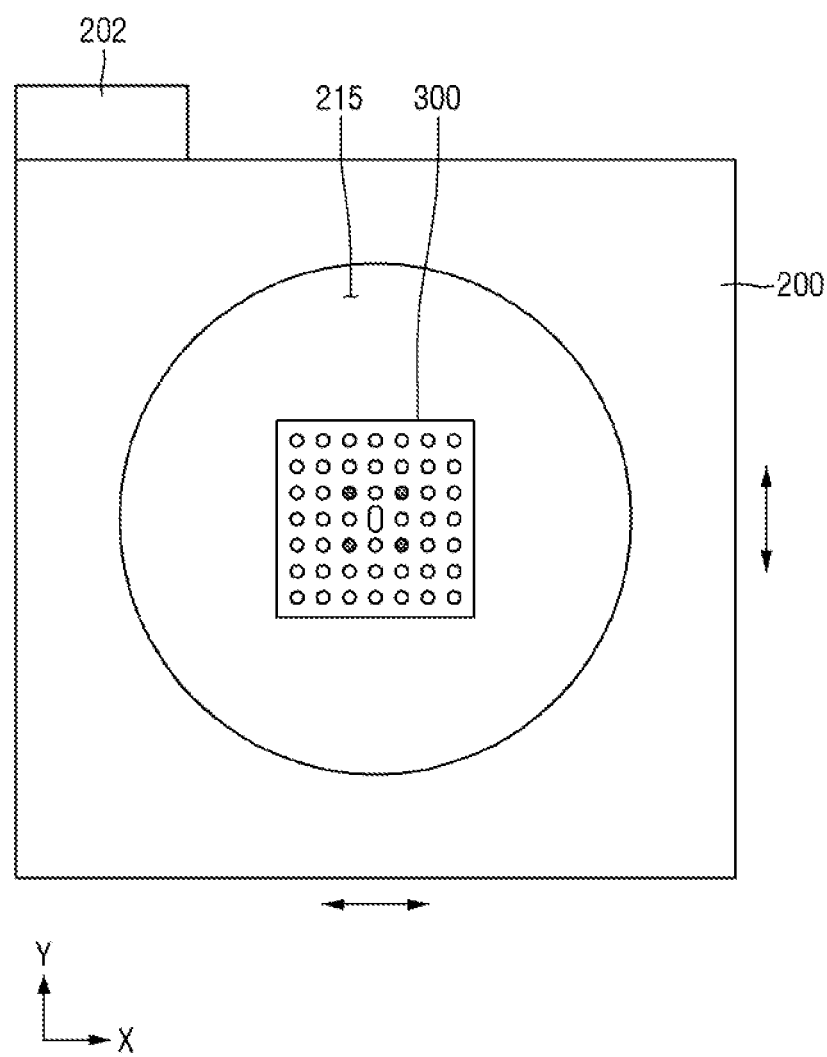

FIG. 1 is a schematic configuration diagram illustrating a chip ejecting apparatus according to example embodiments of the inventive concept. FIG. 2 is a schematic perspective view illustrating an ejector unit of FIG. 1 according to example embodiments of the inventive concept. FIG. 3 is a schematic cross-sectional view illustrating in ejector unit of FIG. 1 according to example embodiments of the inventive concept. FIGS. 4 and 5 are schematic plan views illustrating a table and an ejector unit of a chip ejecting apparatus according to example embodiments of the inventive concept.

Referring to FIGS. 1 to 5, a chip ejecting apparatus 1000 may include a table 200, an ejector unit 300, a picker unit 400, and a control unit 500.

A plurality of chips 120 may be provided on the table 2.00. The plurality of chips 120 may be formed by dividing a wafer into individual chips through a dicing process. Before or after separating the individual chips, the wafer may be processed using a fabrication process, an electrical die sorting process, a back grinding process, or any combination thereof.

The plurality of chips 120 may attached to the dicing tape 110. For example, the dicing tape 110 may be attached to a bottom surface of the wafer, after which the dicing process (i.e., the process of dividing the wafer into individual chips 120) may be performed. The dicing tape 110 may prevent each individual chip from seceding (i.e., separating from the wafer) during the dicing process. The dicing tape 110 may have an upper surface to which the plurality of chips 120 are attached.

The dicing tape 110 may be a wafer tape, a die attach film (DAF), or a stack thereof, but is not limited thereto.

In some examples, the dicing tape 110, to which the plurality of chips 120 are attached, may be fixed to a frame 230 of the table 200. In some embodiments, the frame 230 may be circular in a plan view (not shown). An edge of the dicing tape 110 may be affixed to the frame 230.

In some embodiments, the table 200 may further include a supporting unit 220. The supporting unit 220 may support another portion of the dicing tape 110 adjacent to a portion of the dicing tape 110 to which the plurality of chips 120 are attached, and may be spaced apart from the edge of the dicing tape 110. In some embodiments, the frame 230 of the table 200 may be positioned lower than the supporting unit 220 to secure the dicing tape 110 at the level of the supporting unit 220.

In some example, the adjacent portion of the dicing tape 110 is supported by the supporting unit 220, and the dicing tape 110 may be stretched or expanded outward as the frame 230 descends from an upper position to the lowered position. Expanding the dicing tape 110 may allow the plurality of chips 120 to be more easily separated from the dicing tape 110.

The ejector unit 300 may be disposed within the table 200. For example, as shown in FIGS. 1, 4, and 5, the table 200 may include a space 215 therein. The ejector unit 300 may be disposed in the space 215 of the table 200. The ejector unit 300 may be located below the dicing tape 110. For example, an upper surface of the ejector unit 300 may be disposed to be opposite to a lower surface of the dicing tape 110.

As shown in FIG. 2, the ejector unit 300 may have a square pillar shape. However, the inventive concept is not limited thereto. For example, the ejector unit 300 may have various shapes, such as a cylindrical shape, etc.

The ejector unit 300 may include a plurality of gas holes 310. The plurality of gas holes 310 may be disposed in an upper portion of the ejector unit 300. In some embodiments, the plurality of gas holes 310 may be arranged in a lattice or matrix formation.

Gas may be injected toward the lower surface of the dicing tape 110 from one or more of the gas holes 310. For example, as shown in FIG. 3, each gas hole 310 may be connected to a gas source 340, such as an air pump, though a pipeline 350. In some embodiments, a valve 345 may be installed in the pipeline 350. The gas to be injected from each gas hole 310 may be supplied or blocked by the valve 345.

The gas injected from one or more gas holes 310 may be used to separate a target chip 125 form the dicing tape 110. The target chip 125 may be the chip 120 to be separated from the dicing tape 110 by the ejector unit 300 among the plurality of chips 120. In this regard, it will be described in detail below with reference to FIGS. 8 to 10. The gas may include, for example, air, carbon dioxide ($CO_2$), helium, or the like, but is not limited thereto.

In some embodiments, the gas may include a cooling gas. The cooling gas may harden the dicing tape 110 and, in some cases, one or more of the chips 120, such that the chips 120 may be more easily separated from the dicing tape 110. In some embodiments, each gas hole 310 may have a size (width or diameter), w, of 0.01 mm to 2 mm. In some cases, the size of the gas holes 310, and the spacing between them, may be configured to be less than the width of one of the chips 120. Thus, in some embodiments, a portion of the target chip 125 may be lifted asymmetrically by gas from gas holes 310 on one side of the target chip 125.

In some embodiments, the ejector unit 300 may include a housing 305 having barrel shape and a gas injection unit 315 on an upper portion of the housing 305. The plurality of gas holes 310 may be formed in the gas injection unit 315. The gas injection unit 315 may be connected to the gas source 340 to provide the gas injected through each gas hole 310. A sealing member (not shown) such as an O-ring may be disposed between the housing 305 and the gas injection unit 315 to prevent leakage of the gas provided to each gas hole 310.

In some embodiments, the ejector unit 300 may include one or more eject pins 320. The eject pins 320 may be disposed in the upper portion of the ejector unit 300. In FIG. 2, it is illustrated that the eject pins 320 form a portion of the lattice form formed by the plurality of gas holes 310, but the inventive concept is not limited thereto. For example, the arrangement of the eject pin 320 may be varied according to a shape of the target chip 125 provided on the table 200. In FIG. 2, it is illustrated that four eject pins 320 are disposed in the ejector unit 300, but the inventive concept is not limited thereto. For example, the number of the eject pins 320 may be varied according to a shape of the target chip 125 provided on the table 200.

The eject pins 320 may extend (or project) in a direction perpendicular to the lower surface of the dicing tape 110. For example, the eject pins 320 may extend in a vertical direction. As used herein, the vertical direction may mean a direction perpendicular to an upper surface of the table 200. For example, the eject pin 320 may extend from the inside of the housing 305 to pass through the gas injection unit 315.

The eject pins 320 may operate by extending in the vertical direction toward the target chip 125. The operated eject pins 320 may lift the target chip 125, separating it from the dicing tape 110. The separating process will be described in detail with reference to FIGS. 12 and 13.

In some embodiments, the ejector unit 300 may include an eject pin driver 325. The eject pins 320 may be fixed to the eject pin driver 325. The eject pin driver 325 may be disposed in the housing 305 of barrel shape. The eject pin driver 325 may operate in a direction perpendicular to the upper surface of the table 200 with respect to the housing 305. Thus, the eject pin 320 may operate in the same direction as the extension of the eject pins 320.

In some embodiments, the ejector unit 300 may operate in a horizontal direction with respect to the table 200. As used herein, the horizontal direction may be parallel to the upper surface of the table 200. In some embodiments, the ejector unit 300 may move independently with respect to the table 200. In other embodiments, the table 200 may move while the ejector unit 300 remains in a same position, which effectively causes motion of the ejector unit 300 relative to the table 200.

Thus, chip ejecting apparatus 1000 may inject gas from the gas holes 310 toward a lower surface of the dicing tape 110 beneath a first portion of a target chip 125, inject more gas from the gas holes 310 toward the lower surface of the dicing tape 110 beneath a second portion of the target chip 125, extend the eject pins 320 toward the dicing tape 110 to raise the target chip 125, and pick up the raised target chip 125. In some cases, the first gas is injected using a first subset of the gas holes 310 and the second gas is injected using a second subset of the gas holes 310 distinct from the first subset.

In one embodiment, as shown in FIG. 4, the ejector unit 300 may be connected to a first transfer unit 302. The first transfer unit 302 may position the ejector unit 300 in a first direction X and a second direction Y perpendicular to the first direction X. In the example shown in FIG. 4, the first direction X and the second direction Y are both parallel to a surface of the table 200. Thus, the ejector unit 300 may be operated with respect to the table 200.

In another embodiment, as shown in FIG. 5, the ejector unit 300 may be connected to a second transfer unit 202 for operating the table 200. The second transfer unit 202 may position the table 200 in the first direction X and the second direction Y. Thus, the ejector unit 300 may move relative to the table 200.

The picker unit 400 may be disposed on the table 200. The picker unit 400 may be disposed above the dicing tape 110 and the plurality of chips 120. For example, a lower surface of the picker unit 400 may be opposite to an upper surface of the dicing tape 110 and upper surfaces of the plurality of chips 120.

The picker unit 400 may pick up a chip 120 separated from the dicing tape 110 (e.g., the target chip 125). The picker unit 400 may be positioned horizontally and vertically in order to may pick up the target chip 125 separated from the dicing tape 110. In some embodiments, the picker unit 400 may be rotated before or after picking up the target chip 125.

The control unit 500 may be connected to the ejector unit 300. The control unit 500 may separately control on/off operations of individual gas holes 310. For example, the control unit 500 may set some of the plurality of gas holes 310 to an "on" state in order to inject the gas from those gas holes 310. On the other hand, the control unit 500 may set some of the plurality of gas holes 310 to an "off" state, and thus may block the gas from being injected from those gas holes 310.

In some embodiments, the control unit 500 may select an active gas hole group (see, e.g., group AH of FIGS. 6 to 8) from which the gas is to be injected toward the lower surface of the dicing tape 110, among the plurality of gas holes 310. The selection of active gas hole groups will be described in detail with reference to FIGS. 6 to 8.

The control unit 500 may include at least one of a personal computer (PC), a desktop computer, a lap-top computer, a computer workstation, a tablet PC, a sever, a mobile computing device, or a combination thereof, but is not limited thereto. A mobile computing device may include, for example, a mobile phone, a smart phone, an enterprise digital assistant (EDA), a digital still camera, a digital video camera, a portable multimedia player (PDA), a personal navigation device, a portable navigation device, a mobile internet device (MID), a wearable computer, an Internet of Things (IOT) device, or an Internet of Everything (IOE) device, but is not limited thereto.

Hereinafter, the operation of the chip ejecting apparatus 1000 according to example embodiments will be described with reference to FIGS. 6 to 23.

Figure 6:
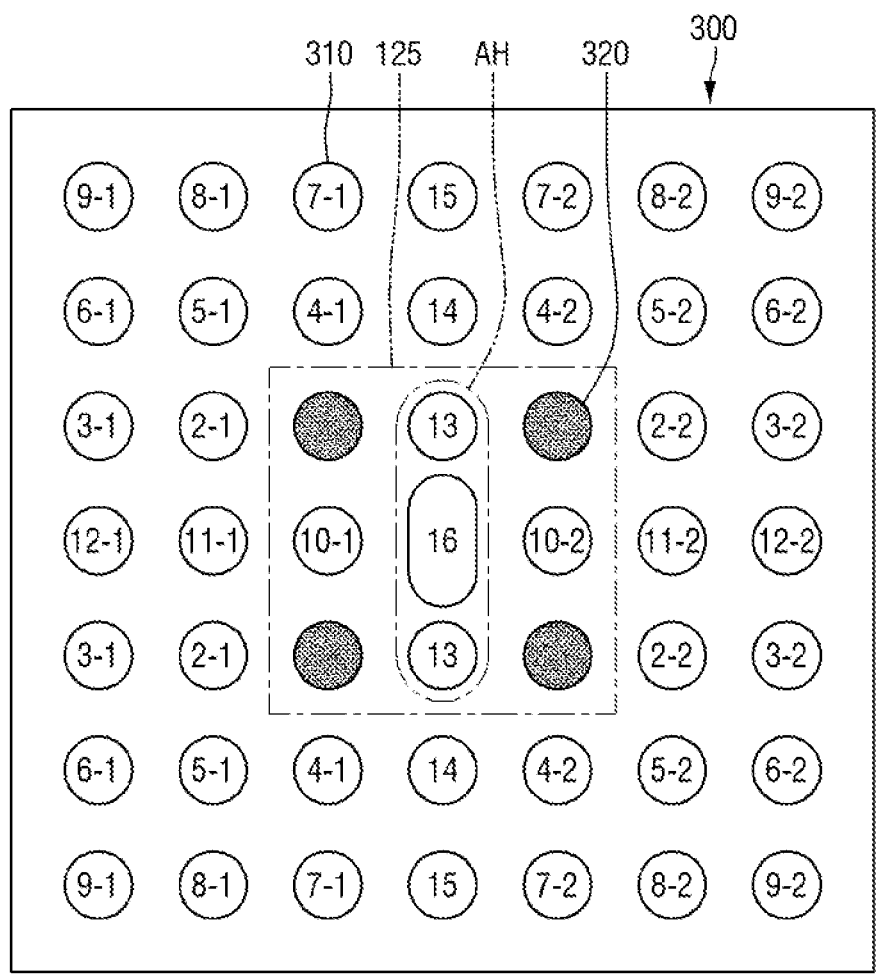
FIGS. 6 to 15 are views illustrating the operation of a chip ejecting apparatus according to example embodiments of the inventive concept.
Figure 7:
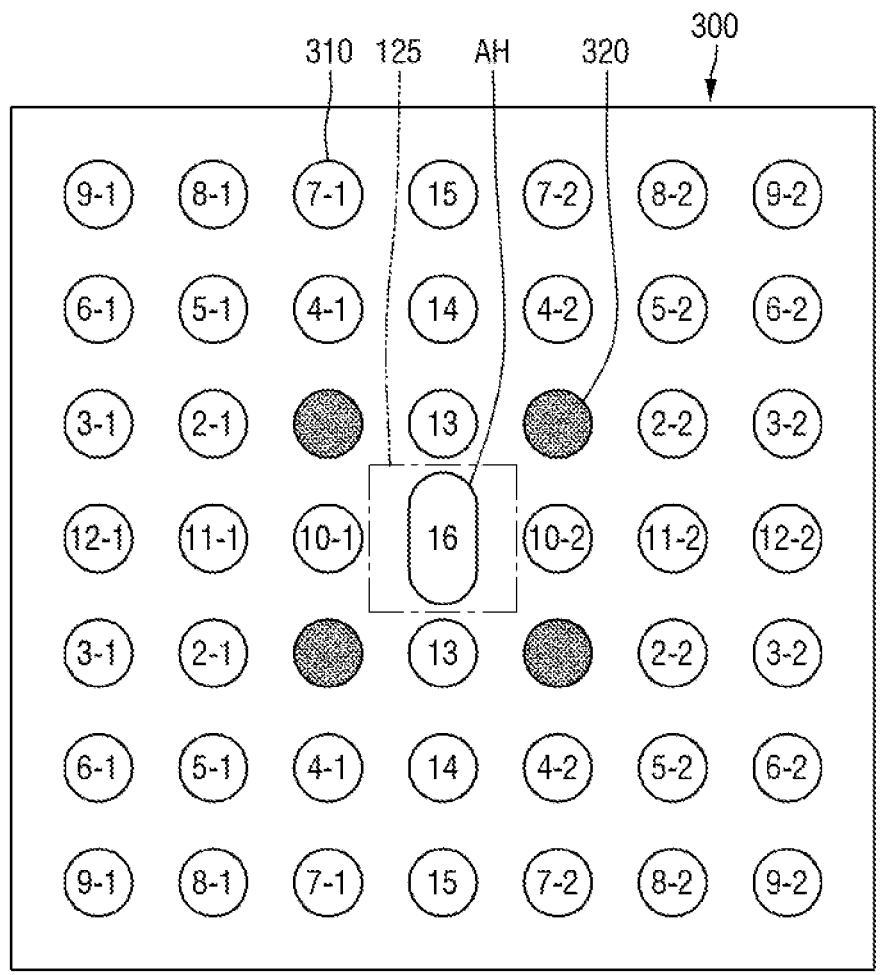
Figure 8:
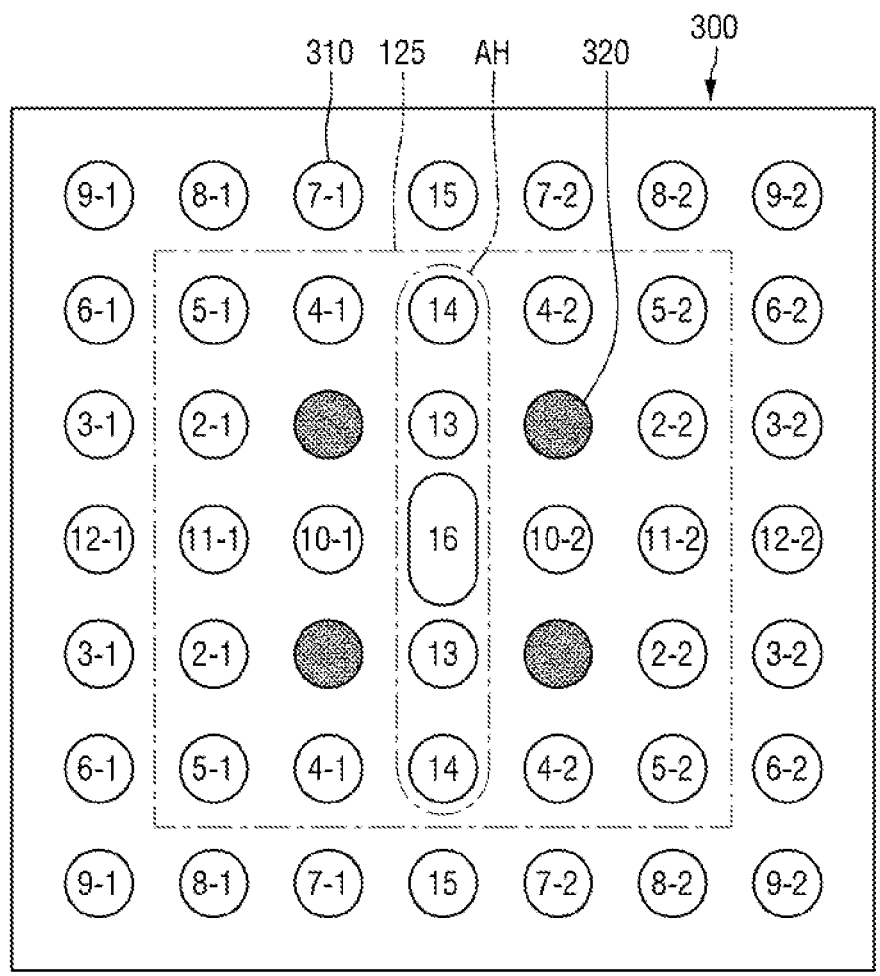

FIGS. 6 to 15 are views illustrating the operation of a chip ejecting apparatus according to example embodiments of the inventive concept. FIGS. 6 to 8 show schematic plan views illustrating gas holes of an ejector unit according to example embodiments of the inventive concept. FIGS. 9 to 15 are cross-sectional views illustrating the operation of an ejector unit according to example embodiments of the inventive concept.

Referring to FIGS. 6 to 8, at least some of the plurality of gas holes 310 corresponding to the target chip 125 may be selected as the active gas hole group AH.

The active gas hole group AH may be selected by the control unit 500 of FIG. 1. For example, as shown in FIG. 6, the control unit 500 may select one or more of gas hole 10-1, gas hole 10-2, gas hole 13, and gas hole 16 that overlap the target chip 125. In some embodiments, the active gas hole group AH may be selected depending on a size of the target chip 125.

For example, as shown in FIG. 7, the size of the target chip 125 may be smaller than the size of the target chip 125 shown in FIG. 6. In this case, the control unit 500 may select only gas hole 16 as the active gas hole group AH. In FIGS. 6 and 7, gas hole 16 is illustrated in an oval shape, of which a major axis extends in the second direction Y, but the example is not limited thereto.

As shown in FIG. 8, the size of the target chip 125 may also be greater than the size of the target chip 125 shown in FIG. 6. In this case, the control unit 500 may select one or more of gas hole 2-1, gas hole 2-2, gas hole 4-1, gas hole 4-2, gas hole 5-1, gas hole 5-2, gas hole 10-1, gas hole 10-2, gas hole 11-1, gas hole 11-2, gas hole 13, gas hole 14, and gas hole 16 as the active gas hole group AH.

In some embodiments, the active gas hole group AH may a plurality of gas holes 310 arranged in one direction. For example, as shown in FIG. 6, the control unit 500 may select only gas hole 13 and gas hole 16, arranged in a line along the second direction Y, as the active gas hole group AH.

In another example, as shown in FIG. 8, the control unit 500 may select only gas hole 13, gas hole 14, and gas hole 16, arranged in a line along the second direction Y, as the active gas hole group AH.

Figure 9:
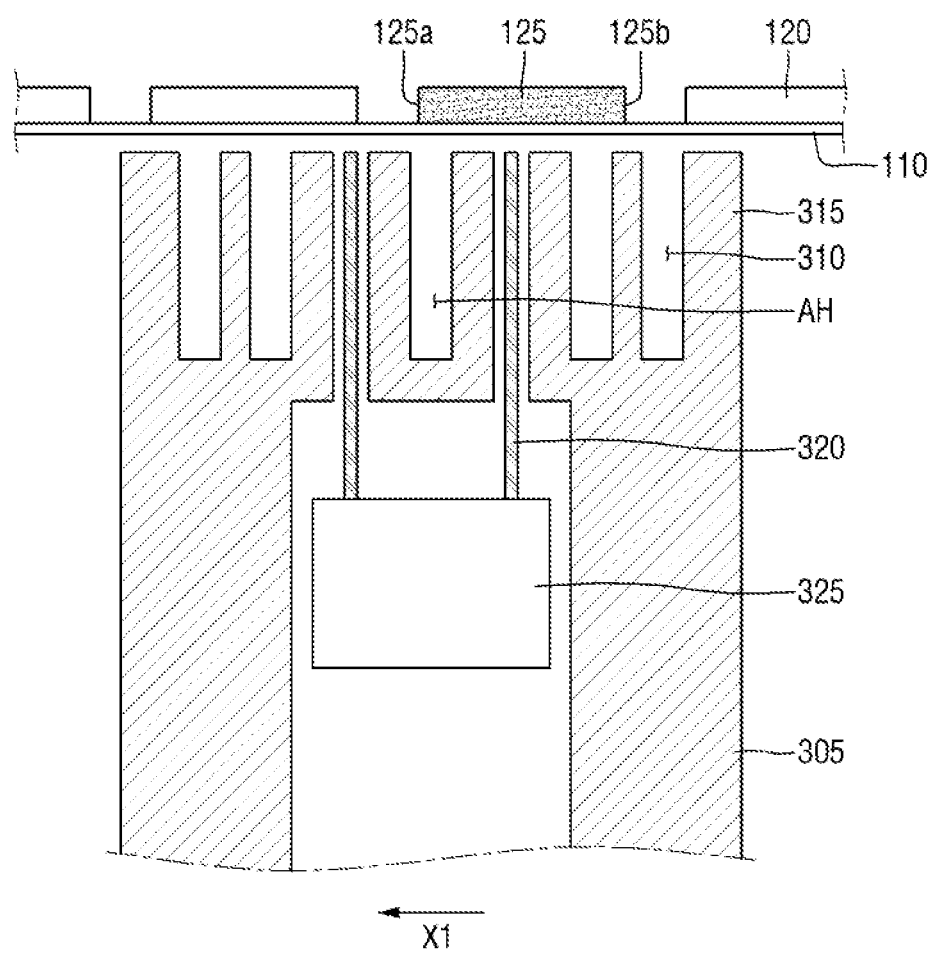

Referring to FIG. 9, the ejector unit 300 may move with respect to the table 200, and thus may allow the active gas hole group AH to be located below one edge of the target chip 125.

For example, the target chip 125 may have opposite first and second edges 125a and 125b. The active gas hole group AH may be positioned below the first edge 125a of the target chip 125. In some embodiments, the first edge 125a and the second edge 125b of the target chip 125 may be opposite to each other in the first direction X of FIG. 6.

Thus, the ejector unit 300 may move in a forward direction X1 to allow the active gas hole group AH to be located below the first edge 125a of the target chip 125. In some embodiments, the forward direction X1 may be parallel to the first direction X of FIG. 6. In some embodiments, the forward direction X1 may be perpendicular to the second direction Y (i.e., the direction in which the active gas hole group AH may extend).

In the drawings, the active gas hole group AH is shown to be located between two eject pins 320, but the inventive concept is not limited thereto.

Figure 10:
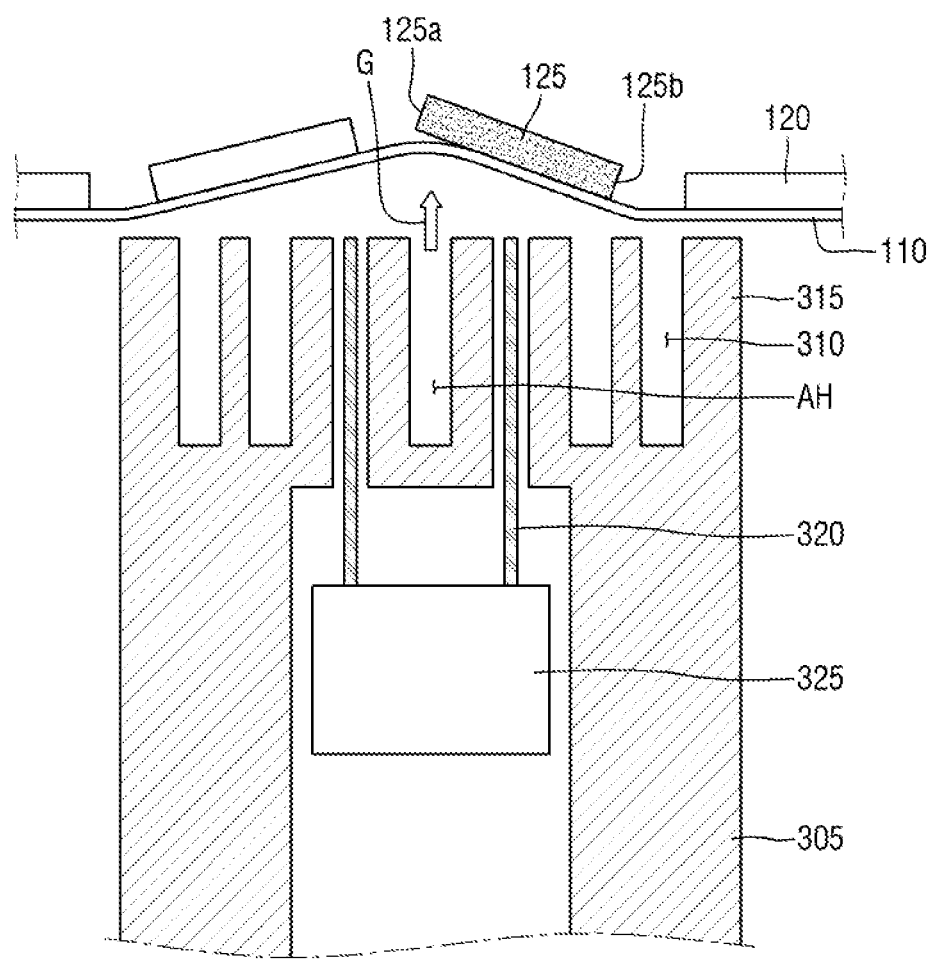
Figure 11:
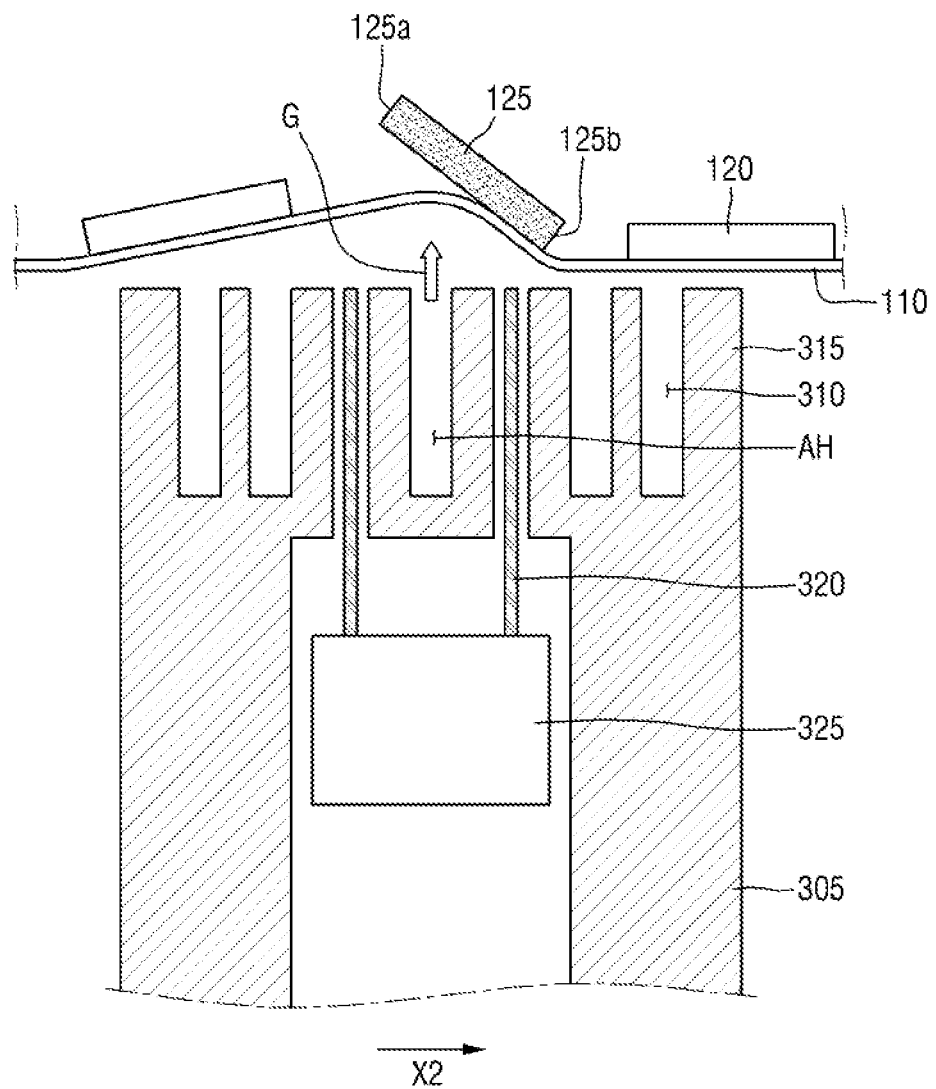
Figure 12:
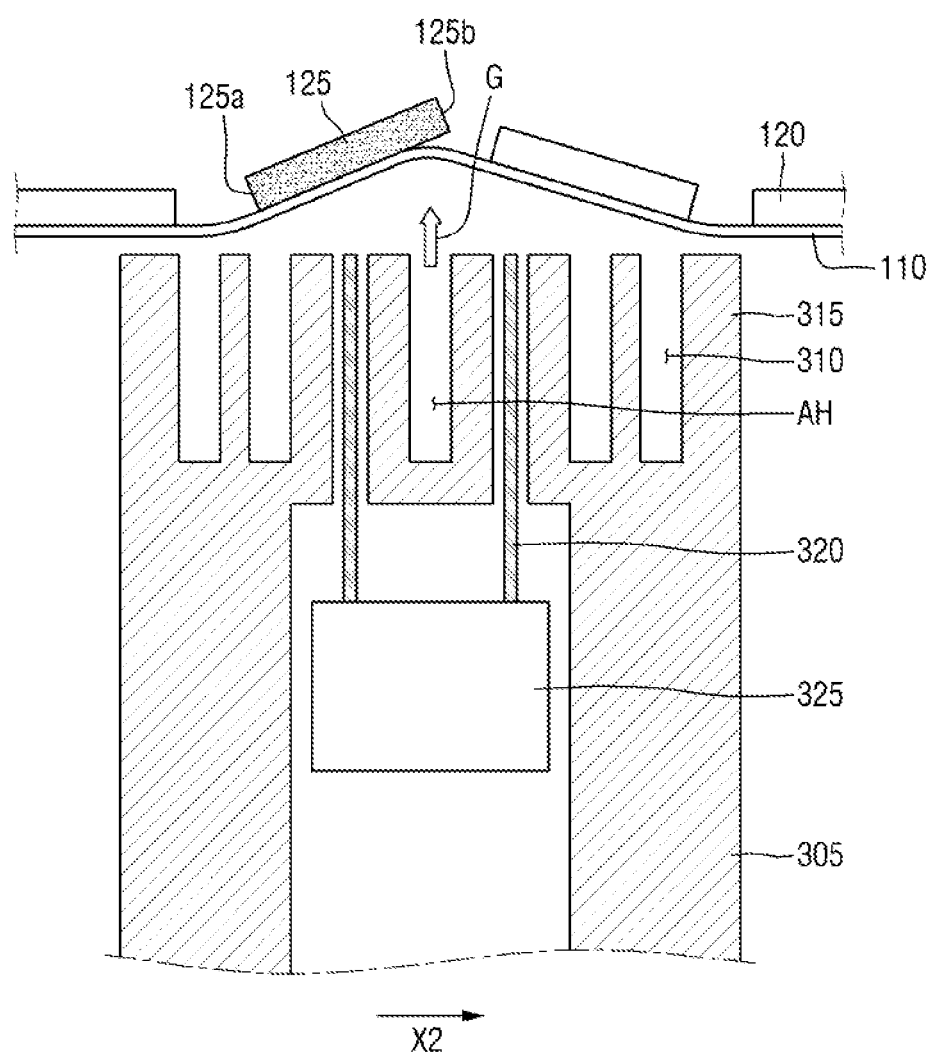

Referring to FIGS. 10 to 12, a first sweeping operation may be performed by the active gas hole group AH. For example, a gas G may be injected from the active gas hole group AH in a direction from the first edge 125a of the target chip 125 toward the second edge 125b of the target chip 125.

In some embodiments, the active gas hole group AH may move with respect to the target chip 125, and may inject the gas G toward the lower surface of the dicing tape 110 while moving.

Referring to FIG. 10, the gas G may be injected toward the first edge 125a of the target chip 125 from the active gas hole group AH which may be located below the first edge 125a of the target chip 125. As a result, the lower surface of the target chip 125 adjacent to the first edge 125a may be separated from the dicing tape 110.

Referring to FIG. 11, the active gas hole group AK may move in a reverse direction X2 opposite to the forward direction X1, and the gas G may be injected toward the lower surface of the dicing tape 110 during or after the motion. Thus, the gas G may be injected from the active gas hole group AH toward a central portion of the target chip 125. At that time, part of the lower surface of the central portion of the target chip 125 may be separated from the dicing tape 110.

Referring to FIG. 12, the active gas hole group AH may further move in the reverse direction X2, and the gas G may be injected from the active gas hole group AH toward the lower surface of the dicing tape 110 during or after the motion. Thus, the gas G may be injected from the active gas hole group AH toward the second edge 125b of the target chip 125. At that time, the lower surface of the target chip 125 adjacent to the second edge 125b thereof may be separated from the dicing tape 110.

In some cases, the target chip 125 remains in contact with the dicing tape 110 after the first sweeping operation. However, the adhesion between the dicing tape 110 and the target chip 125 may be significantly lowered through the first sweeping operation.

Figure 13:
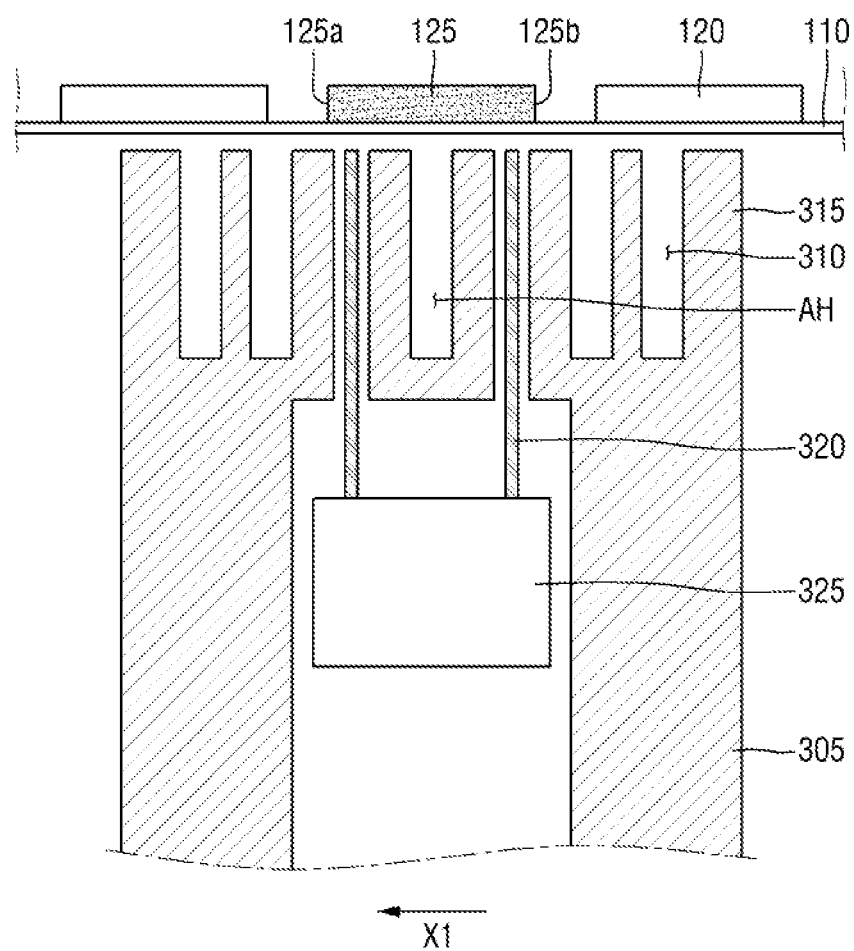

Referring to FIG. 13, the ejector unit 300 may move with respect to the table 200 to allow the target chip 125 to be located over the eject pins 320. As shown in the drawings, when the active gas hole group AH is located between the eject pins 320, a central portion of the target chip 125 may be located over the active gas hole group AH.

According to an example embodiment, two eject pins 320 may be located adjacent to the first edge 125a and two eject pins 320 may be located adjacent to the second edge 125b, but the inventive concept is not limited thereto. For example, the arrangements and the number of the eject pins 320 may be varied according to a shape and size of the target chip 125.

Figure 14:
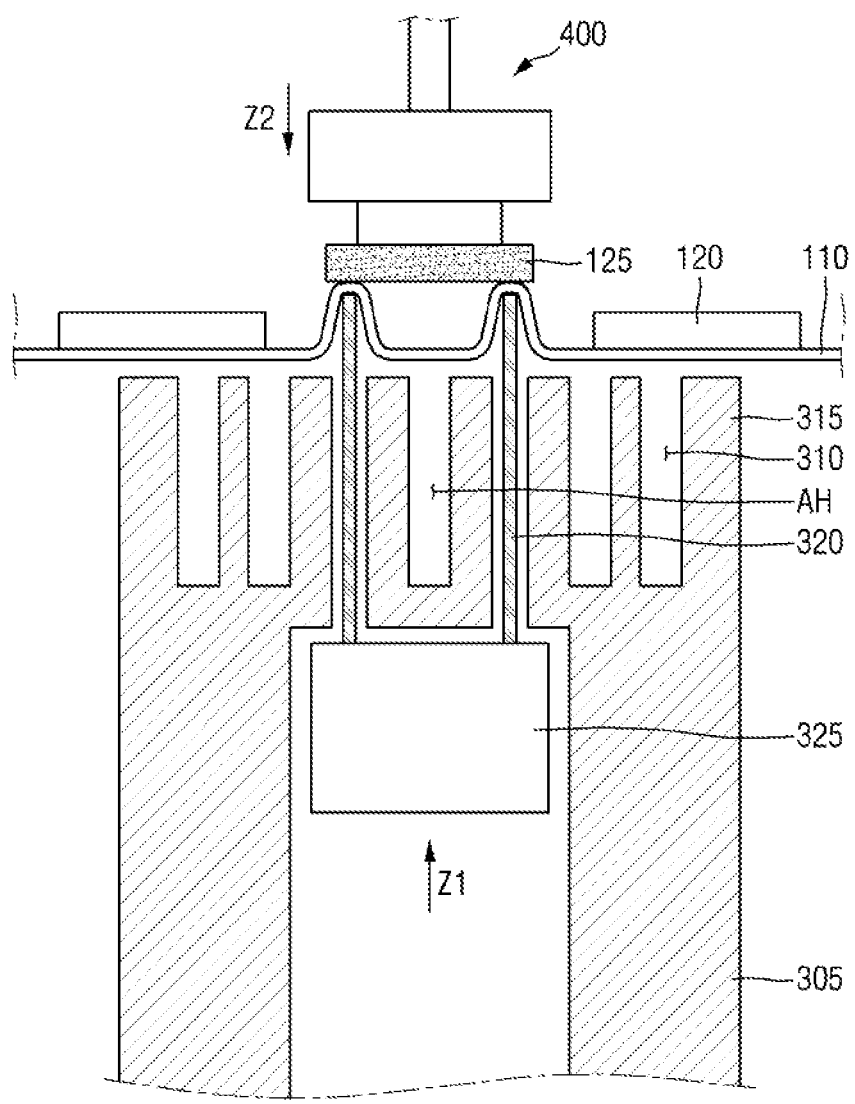

Referring to FIG. 14, the eject pins 320 may extend toward the target chip 125.

For example, the eject pin driver 325 to which the eject pins 320 are fixed may move in an upward direction Z1. Thus, an upper portion of the eject pins 320 may protrude from the gas injection unit 315. As a result, the upper portion of the eject pins 320 may contact the dicing tape 110 and lift the target chip 125. Thus, the target chip 125 may rise above the other chips adhered to the dicing tape 110.

The eject pins 320 extending toward the target chip 125 may enable the picker unit 400 to pick up the target chip 125. For example, the picker unit 400 may move toward the target chip 125 and may pick up the target chip 125. For example, the picker unit 400 may move in a downward direction Z2 and may pick up the target chip 125 raised by the eject pins 320.

For example, the picker unit 400 may pick up the target chip 125 using a suction or vacuum manner, but the disclosure is not limited thereto.

Figure 15:
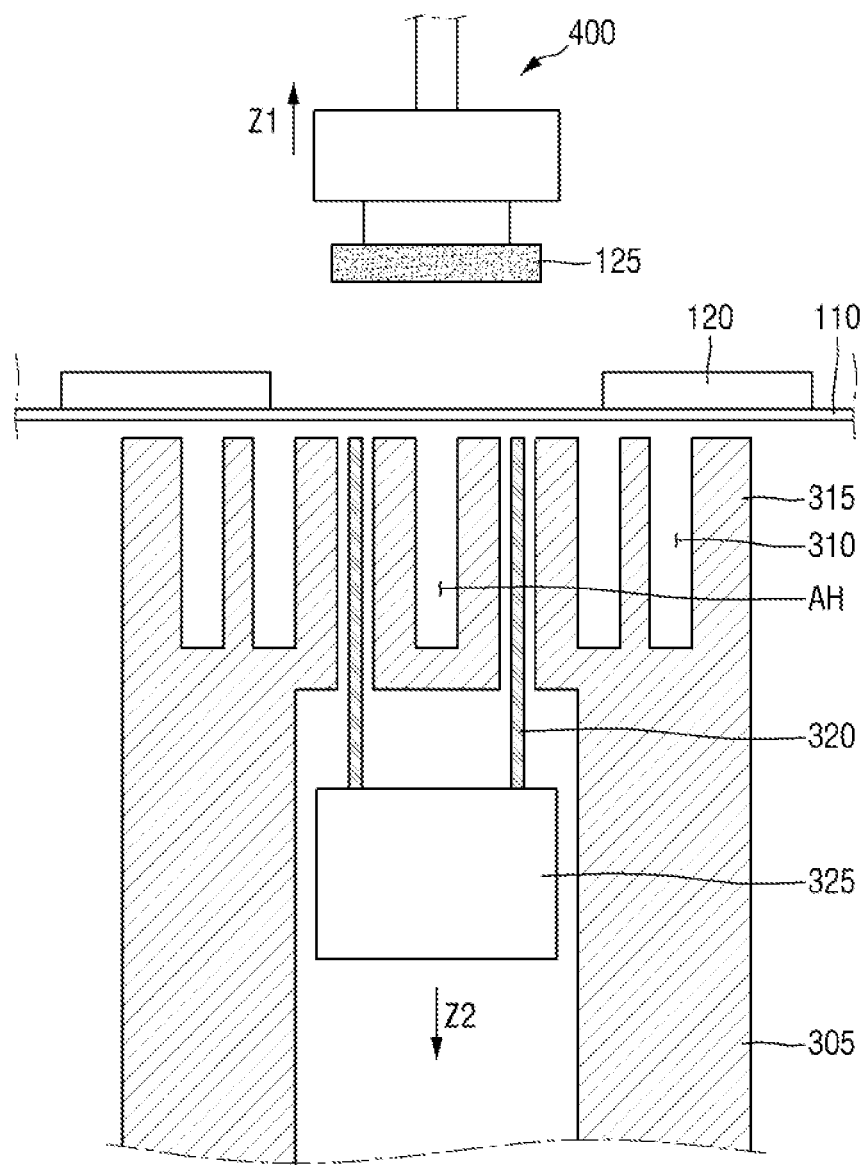

Referring to FIG. 15, the eject pins 320 may descend once the picker unit 400 picks up the target chip 125. For example, the eject pin driver 325 to which the eject pins 320 are fixed may move in the downward direction Z2.

The picker unit 400 may move the target chip 125 and separate it from the dicing tape 110. For example, the picker unit 400 may move in the upward direction Z1 while holding the target chip 125. Thus, the target chip 125 may be completely separated from the dicing tape 110, and thus may be provided to another apparatus for transportation or further processing.

In some embodiments, the picker unit 400 may provide the target chip 125 to a bonding unit (not shown). The bonding unit may bond the target chip 125 provided from the picker unit 400 to a substrate (e.g., a printed circuit board (PCB) or a lead frame).

As the thickness of the chips formed on the wafer becomes smaller, they may become more fragile and productivity may be lowered. For example, when the chips are thin, adhesion between the chip and the dicing tape may be large relative to the strength of the chip, and thus the chip may be damaged in the process of physically elevating the chip (i.e., using an eject pin or the like). However, according to embodiments of the present disclosure, the adhesion between the target chip 125 and the dicing tape 110 is significantly lowered using ejected gas, without physical contact, prior to operation of the eject pins 320. Thus, damage to the target chip 125 by the eject pin 320 may be minimized or prevented.

In addition, varying the size of the chips formed on the wafer may also lower productivity. For example, when chips of various sizes are separated from the dicing tape, a portion of the chip ejecting apparatus may be altered or replaced according to the size of the chip. However, according to example embodiments of the inventive concept, the gas holes 310 may be separately controlled. Thus, chips 120 of various sizes may be separated from the dicing tape 110 without replacing any portion of the chip ejecting apparatus 1000.

Therefore, in, the die attaching process according to embodiments of the present disclosure, the chip ejecting apparatus 1000 is capable of being used in a wide variety of cases, regardless of the thickness and size of the chip 120. Furthermore, the die attaching process described herein may result in reduced damage to the chips 120.

Figure 16:
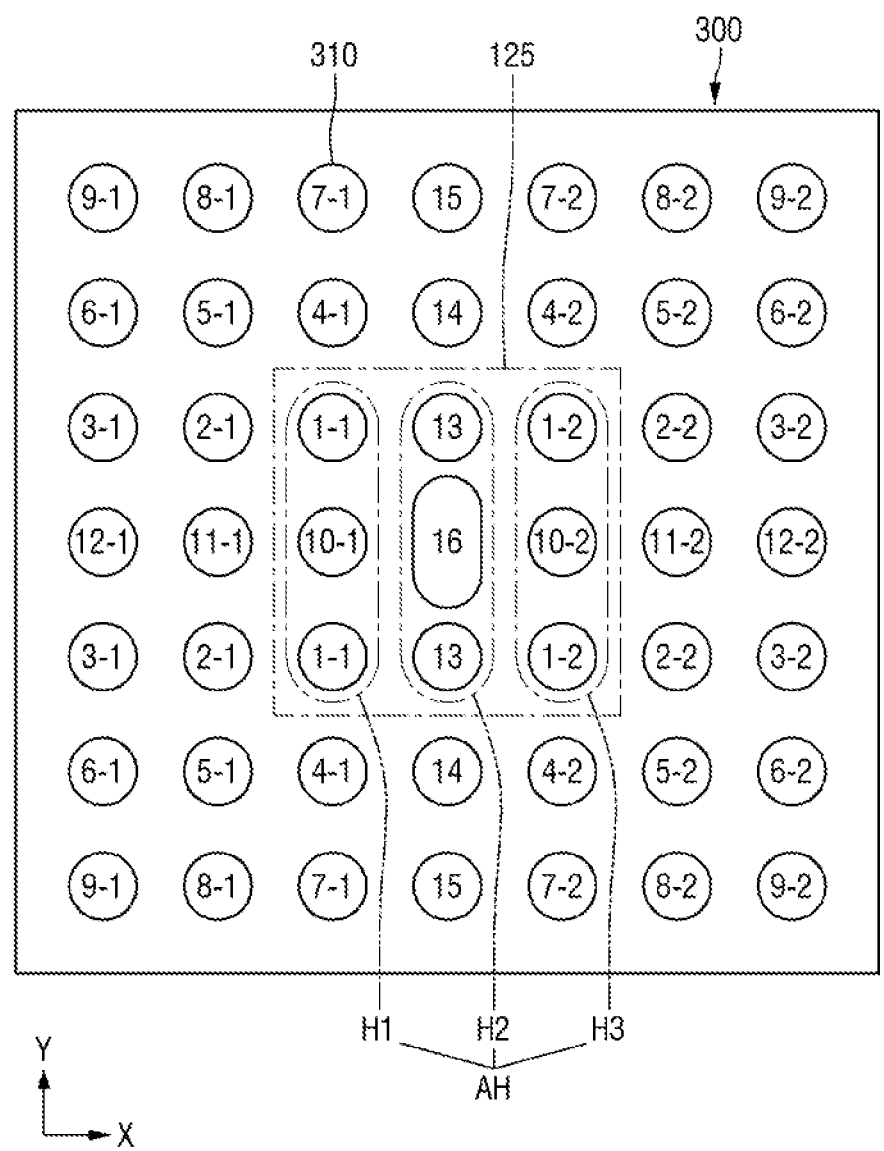
FIGS. 16 to 21 are views illustrating the operation of a chip ejecting apparatus according to example embodiments of the inventive concept.

FIGS. 16 to 21 are views illustrating the operation of a chip ejecting apparatus according to example embodiments of the inventive concept. FIG. 16 is a schematic plan view illustrating gas holes of an ejector unit. FIGS. 17 to 21 are schematic cross-sectional views illustrating the operation of the ejector unit. In FIGS. 16 to 21, elements corresponding to the examples described with reference to FIGS. 1 to 15 will be described in brief or omitted. For the convenience of explanation, in FIG. 16, the illustration of the eject pins 320 is omitted.

Referring to FIG. 16, in the chip ejecting apparatus 1000 of FIG. 1, according to example embodiments, the active gas hole group AH may include a plurality of gas hole groups H1, H2, and H3 that are separately controlled.

For example, at least some of gas hole 1-1, gas hole 1-2, gas hole 10-1, gas hole 10-2, gas hole 13, and gas hole 16 corresponding to the target chip 125 may be selected as the active gas hole group AH.

In some embodiments, the active gas hole group AH may be divided into a plurality of gas hole groups H1, H2, and H3, each of which includes a plurality of gas holes 310 arranged in one direction. For example, the active gas hole group AH may be divided into a first gas hole group H1, a second gas hole group H2, and a third gas hole group H3.

The first gas hole group H1, the second gas hole group H2, and the third gas hole group H3 may be arranged relative to each other in the first direction X.

The first gas hole group H1 may include, for example, gas hole 1-1 and gas hole 10-1 arranged in a row along the second direction Y.

The second gas hole group H2 may include, for example, gas hole 13 and gas hole 16 arranged in a row along the second direction Y.

The third gas hole group H3 may be spaced apart from the first gas hole group H1 with the second gas hole group H2 between them. The third gas hole H3 may include, for example, gas hole 1-2 and gas hole 10-2 arranged in a row along the second direction Y.

Figure 17:
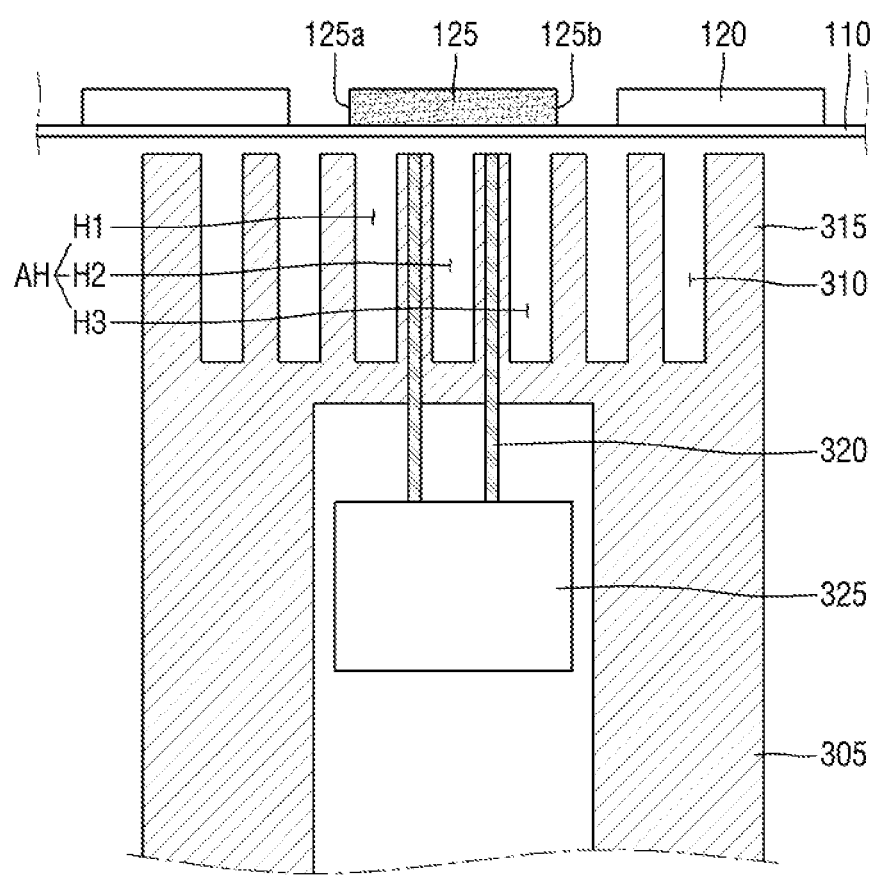

Referring to FIG. 17, the active gas hole group AH may be located below the target chip 125.

For example, the first gas hole group H1 may be located adjacent to the first edge 125a of the target chip 125, the second gas hole group H2 may be located adjacent to the central portion of the target chip 125, and the third gas hole group H3 may be located adjacent to the second edge 125b of the target chip 125.

In one embodiment, the eject pins 320 may be located between the first gas hole group H1 and the second gas hole group H2, and between the second gas hole group H2 and the third gas hole group H3, but the inventive concept is not limited thereto.

Figure 18:
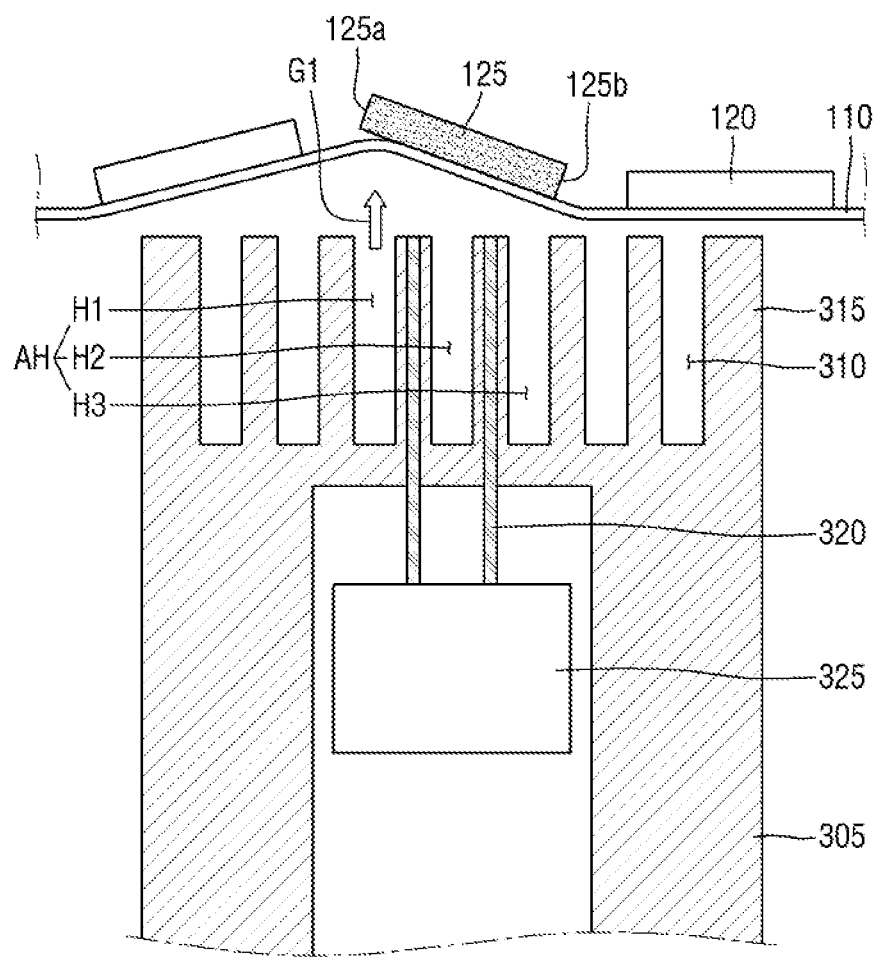
Figure 19:
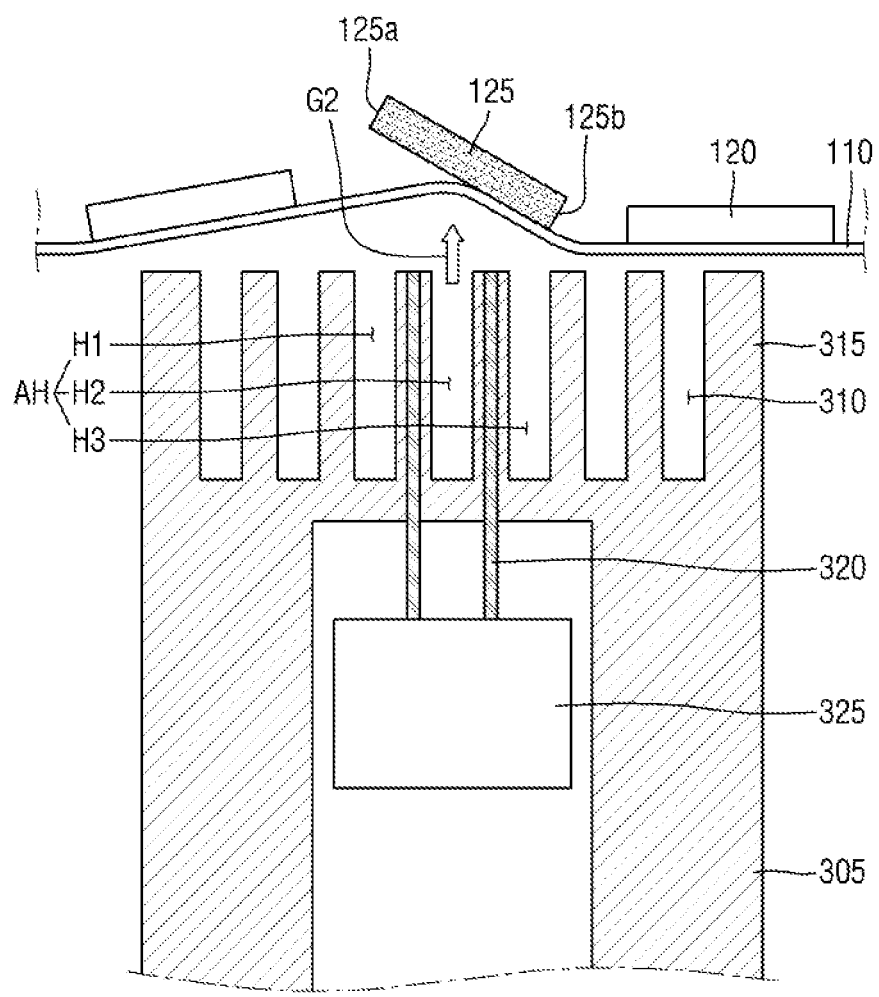
Figure 20:
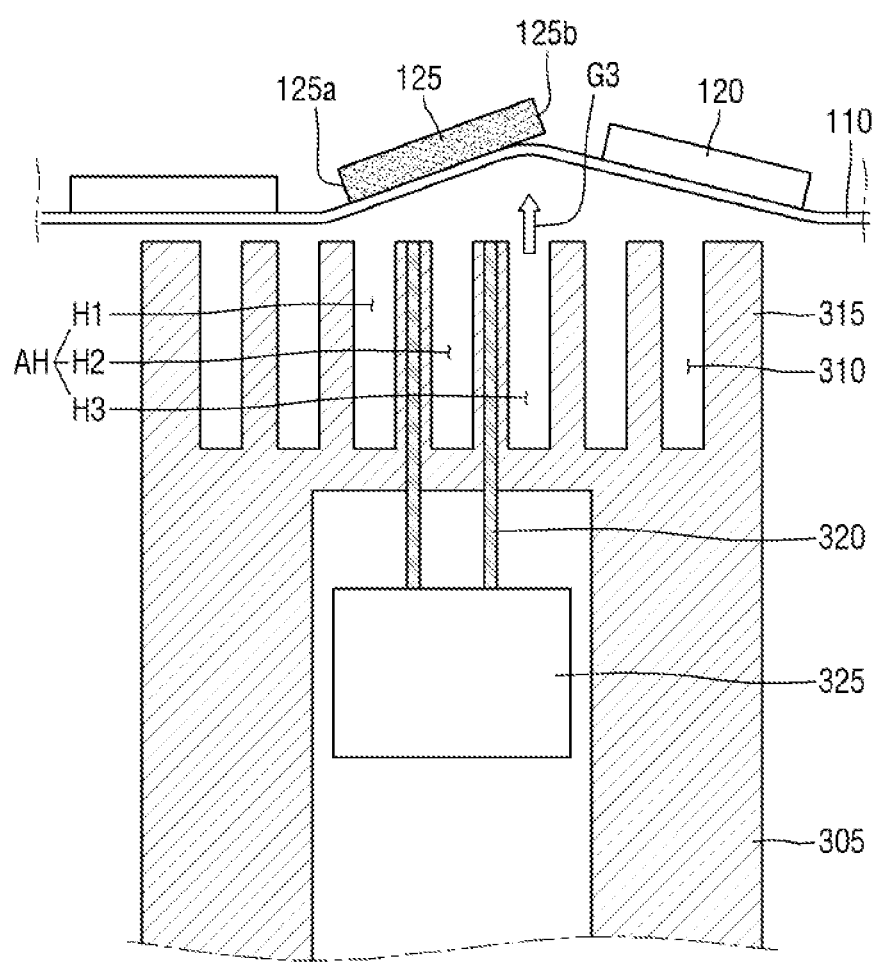

Referring to FIGS. 18 to 20, a second sweeping operation may be performed by the active gas hole group AH. For example, first gas G1, second gas G2, and third gas G3 may be injected from the active gas hole group AH in an order starting with the first gas G1 being injected under the first edge 125a of the target chip 125, and ending with the gas G3 being injected under the second edge 125b of the target chip 125.

In some embodiments, the first gas hole group H1, the second gas hole group H2, and the third gas hole group H3 may be sequentially operated and may inject the gases G1, G2, and G3 toward the lower surface of the dicing tape 110.

Referring to FIG. 18, operation of the first gas hole group H1 below the first edge 125a of the target chip 125 may be performed. Thus, the first gas G1 may be injected from the first gas hole group H1 toward the first edge 125a of the target chip 125. At that time, a lower surface of the target chip 125 adjacent to the first edge 125a of the target chip 125 may be separated from the dicing tape 110.

In some embodiments, while the operation of the first gas hole group H1 is performed, the second gas hole group H2 and the third gas hole group H3 may be maintained in an "off" operating state.

Referring to FIG. 19, after the operation of the first gas hole group H1, an operation of the second gas hole group H2 below the central portion of the target chip 125 may be performed. Thus, a second gas G2 may be injected from the second gas hole group H2 toward the lower surface of the central portion of the target chip 125. At that time, part of the lower surface of the central portion of the target chip 125 may be separated from the dicing tape 110.

In some embodiments, while the operation of the second gas hole group H2 is performed, the first gas hole group H1 and the third gas hole group H3 may be maintained in the "off" operating state.

Referring to FIG. 20, after the operation of the second gas hole group H2, an operation of the third gas hole group H3 below the second edge 125b of the target chip 125 may be performed. Thus, a third gas G3 may be injected from the third gas hole group H3 toward the second edge 125b of the target chip 125. At that time, the lower surface of the target chip 125 adjacent to the second edge 125b may be separated from the dicing tape 110. Thus, the adhesion between the dicing tape 110 and the target chip 125 may be significantly lowered through the second sweeping operation.

In some embodiments, while the operation of the third gas hole group H3 is performed, the first gas hole group and the second gas hole group H2 may be maintained in the "off" operating state.

Figure 21:
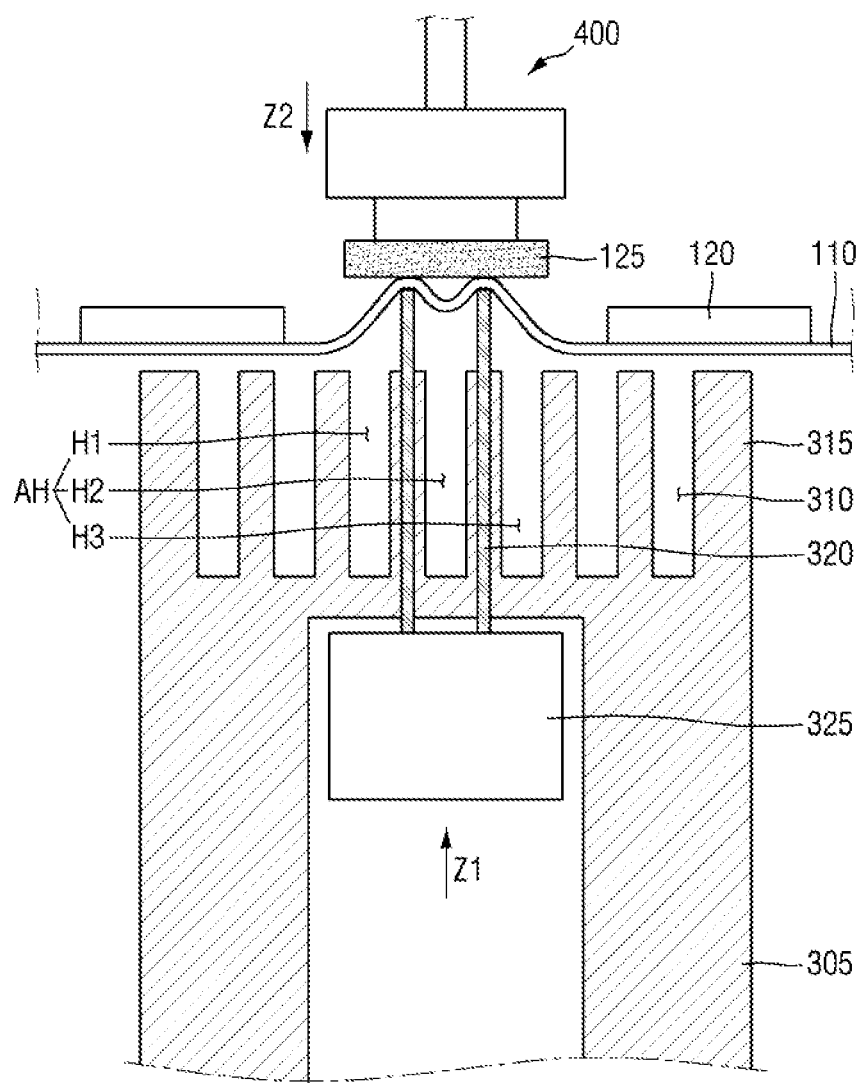

Referring to FIG. 21, the eject pins 320 may be extended toward the target chip 125. The operation of the eject pins 320 may be substantially the same as described with reference to FIG. 14. Thus, the target chip 125 may be separated from the dicing tape 110 and may be provided to another apparatus for transportation or processing.

Therefore, according to the die attaching process described herein, the chip ejecting apparatus 1000 is capable of being used in wide variety of circumstances, regardless of the thickness and size of the chip 120. Furthermore, the process described herein may reduce or minimize the damage to the chip 120.

Figure 22:
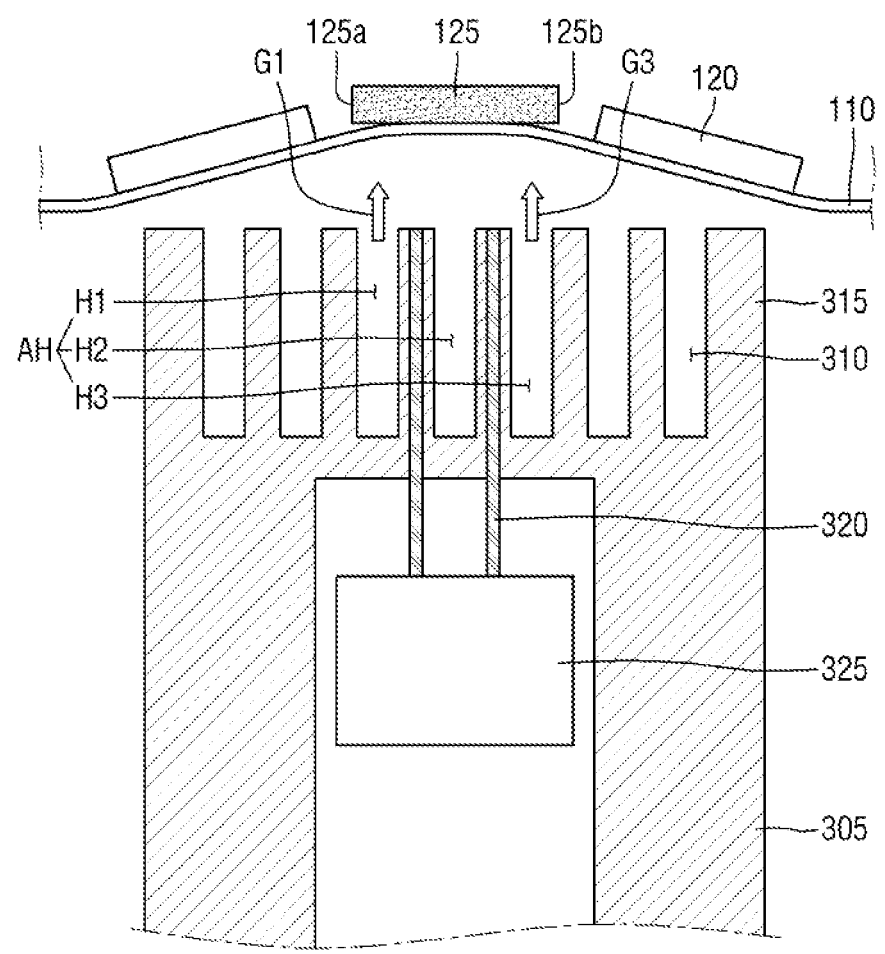
FIGS. 22 and 23 are views illustrating the operation of a chip ejecting apparatus according to example embodiments of the inventive concept.
Figure 23:
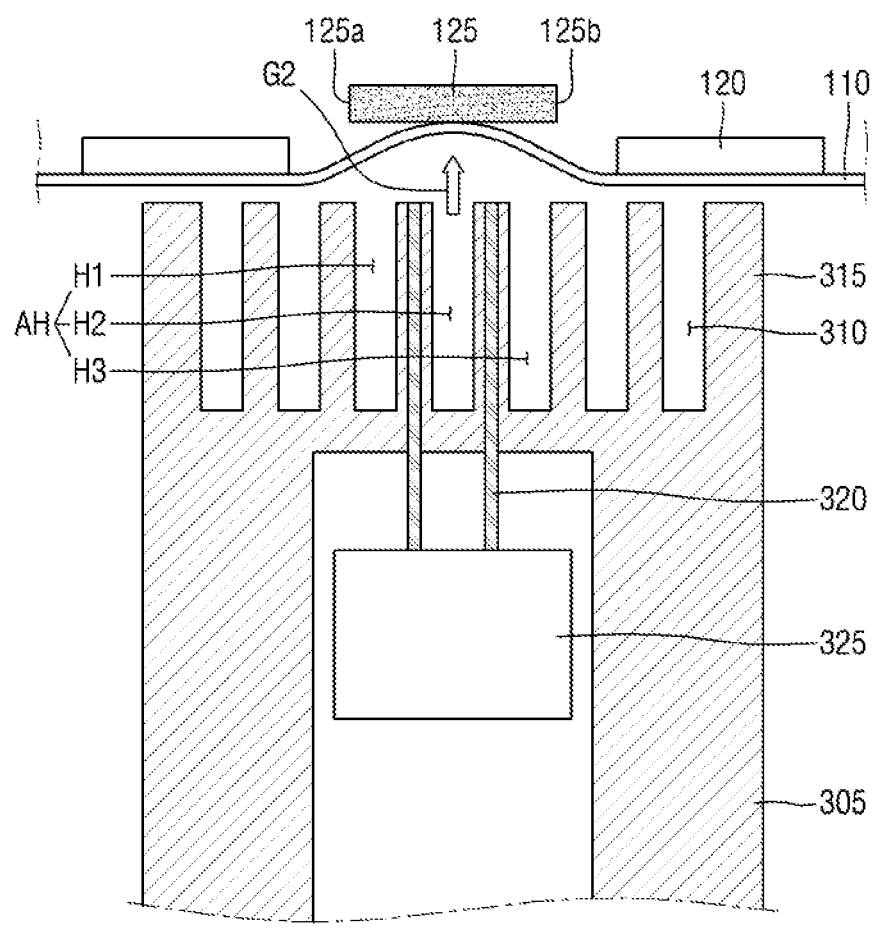

FIGS. 22 and 23 are views illustrating the operation of a chip ejecting apparatus according to example embodiments of the inventive concept. FIGS. 22 and 23 are schematic cross-sectional views illustrating the operation of an ejector unit. In FIGS. 16 to 21, duplicate elements will be described briefly, or omitted.

Referring to FIGS. 22 and 23, a third sweeping operation may be performed by the active gas hole group AH. According to the third sweeping operation, gas may be simultaneously injected from the active gas hole group AH along the direction extending from the first edge 125a toward the second edge 125b, and along the direction extending from the second edge 125b toward the first edge 125a. For example, the gas may be injected from the active gas hole group AH along a direction extending from the first edge 125a and the second edge 125b toward the center of the target chip 125.

For example, the gas may be injected from the second gas hole group H2 after the gas injected from the first gas hole group H2 and the third gas hole group H3. In other words, gas may be injected near the edges of the target chip 125 prior to gas being injected near the center of the target chip 125.

Referring to FIG. 22, an operation of the first gas hole group H1 below the first edge 125a of the target chip 125 and an operation of the third gas hole group H3 below the second edge 125b of the target chip 125 may be performed. In some embodiments, the operation of the first gas hole group and the operation of the third gas hole group H3 may be performed at substantially the same time. Thus, the first gas G1 and the third gas G3 may be injected toward the first edge 125a and the second edge 125b, respectively, of the target chip 125.

In some embodiments, during the operation of the first gas hole group H1 and the operation of the third gas hole group H3, an "off" operating state of the second gas hole group H2 may be maintained.

Referring to FIG. 23, after the operation of the first gas hole group H1 and the operation of the third gas hole group H3, an operation of the second gas hole group H2 below the central portion of the target chip 125 may be performed. Thus, the second gas G2 may be injected toward the central portion of the target chip 125.

In some embodiments, during the operation of the second gas hole group H2, an "off" operating state of the first gas hole group H1 and an "off" operating state of the third gas hole group H3 may be maintained. Thus, the lower surface of the target chip 125 adjacent to the first edge 125a of the target chip 125 and the lower surface of the target chip 125 adjacent to the second edge 125b of the target chip 125 may be separated from the dicing tape 110.

Therefore, according to the die attaching process described herein, the chip ejecting apparatus 1000 may be capable of being used in a wide variety of circumstances regardless of the thickness and size of the chip 120. Furthermore, the process described herein may reduce or minimize the damage to the chip 120.

While the present inventive concepts have been shown and described with reference to example embodiments thereof, it will be understood by those of ordinary skill in the art that various changes in form and details may be made thereto without departing from the spirit and scope of the present inventive concepts as set forth by the following claims.

What is claimed is:

1. A chip ejecting apparatus comprising:
a table provided with a dicing tape and a target chip adhered to an upper surface of the dicing tape;
an ejector including a plurality of gas holes configured to inject a gas toward a lower surface of the dicing tape, wherein the ejector further comprises an eject pin configured to extend toward the target chip; and
a controller configured to separately control on/off operations of the plurality of gas holes and select a gas hole group from among the plurality of gas holes, wherein the gas hole group is selected to overlap the target chip, and
wherein the gas hole group is configured to inject the gas toward the dicing tape along a direction from a first edge of the target chip toward a second edge of the target chip opposite to the first edge of the target chip.

2. The apparatus according to claim 1, wherein the gas hole group is configured to move with respect to the table and to inject the gas along the direction from the first edge of the target chip toward the second edge of the target chip.

3. The apparatus according to claim 1, wherein the gas hole group comprises a first gas hole group adjacent to the first edge of the target chip and a second gas hole group adjacent to a central portion of the target chip, and
the controller is configured to operate the second gas hole group after operating the first gas hole group.

4. The apparatus according to claim 1, wherein the plurality of gas holes are arranged in a lattice form.

5. The apparatus according to claim 1, wherein the first edge and the second edge of the target chip are opposite to each other in a first direction, and
the gas hole group comprises at least two gas holes arranged in a second direction crossing the first direction among the plurality of gas holes.

6. The apparatus according to claim 1, wherein the gas includes a cooling gas.

7. A chip ejecting apparatus comprising:
a table provided with a dicing tape and a target chip adhered to an upper surface of the dicing tape;
an ejector configured to separate the target chip from the dicing tape; and
a picker configured to pick up the separated target chip;
wherein the ejector comprises a plurality of gas holes configured to inject a gas toward a lower surface of the dicing tape and an eject pin configured to project in a direction crossing a direction parallel to the lower surface of the dicing tape,
the plurality of gas holes are configured to inject the gas toward the target chip along a direction from a first edge of the target chip toward a second edge of the target chip opposite to the first edge of the target chip, and
the eject pin is configured to extend toward the target chip and to provide the target chip to the picker after the gas is injected toward the target chip.

8. The apparatus according to claim 7, wherein, before the gas is injected toward the target chip, the ejector is configured to operate with respect to the table and to place a gas hole group that injects the gas toward the target chip from among the plurality of gas holes, below the first edge of the target chip.

9. The apparatus according to claim 7, wherein, after the gas is injected toward the target chip and before the eject pin is operated toward the target chip, the ejector is moved with respect to the table to place the target chip over the eject pin.

10. The apparatus according to claim 7, wherein the ejector further comprises:
a housing;
a gas injection unit disposed on the housing and including the plurality of gas holes; and
an eject pin driver disposed in the housing and connected to the eject pin.

11. The apparatus according to claim 10, wherein the eject pin driver is configured to operate with respect to the table in a direction crossing a direction parallel to an upper surface of the table.

12. The apparatus according to claim 10, wherein the eject pin passes through the gas injection unit.

13. The apparatus according to claim 7, further comprising a controller configured to separately control on/off operations of the plurality of gas holes.

14. The apparatus according to claim 7, wherein each of the plurality of gas holes has a width of 0.01 mm to 2 mm.

15. A chip ejecting apparatus comprising:
a table provided with a dicing tape and a target chip adhered to an upper surface of the dicing tape;
an ejector including a plurality of gas holes configured to inject a gas toward a lower surface of the dicing tape; and a controller configured to separately control on/off operations of the plurality of gas holes and to select a gas hole group from among the plurality of gas holes, wherein the gas hole group is selected to overlap the target chip, and wherein the gas hole group comprises a first gas hole group adjacent to a first edge of the target chip, a second gas hole group adjacent to a central portion of the target chip, and a third gas hole group adjacent to a second edge of the target chip opposite to the first edge of the target chip, wherein the controller is configured to perform the on operation of the first gas hole group and an on operation of the third gas hole group at the same time, and wherein the controller is configured to perform the on operation of the second gas hole group after performing an on operation of the first gas hole group.

16. The apparatus according to claim 15, wherein the first gas hole group and the second gas hole group are arranged in a first direction, the first gas hole group comprises first gas holes arranged in a second direction crossing the first direction, and the second gas hole group comprises second gas holes arranged in the second direction.

17. The apparatus according to claim 15, wherein the ejector further comprises an eject pin configured to project toward the target chip after the on operation of the second gas hole group is performed.

* * * * *